(12) United States Patent
An

(10) Patent No.: US 9,633,737 B2
(45) Date of Patent: Apr. 25, 2017

(54) SEMICONDUCTOR DEVICE

(71) Applicant: SK hynix Inc., Gyeonggi-do (KR)

(72) Inventor: Chi Wook An, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/090,270

(22) Filed: Apr. 4, 2016

(65) Prior Publication Data

US 2016/0217863 A1     Jul. 28, 2016

Related U.S. Application Data

(63) Continuation-in-part of application No. 14/686,492, filed on Apr. 14, 2015, now Pat. No. 9,564,220.

(30) Foreign Application Priority Data

Nov. 18, 2014    (KR) ........................ 10-2014-0160704

(51) Int. Cl.
| | |
|---|---|
| *G11C 16/10* | (2006.01) |
| *G11C 16/14* | (2006.01) |
| *G11C 7/10* | (2006.01) |
| *G11C 8/12* | (2006.01) |
| *G11C 16/04* | (2006.01) |
| *G11C 16/08* | (2006.01) |
| *G11C 16/16* | (2006.01) |
| *G11C 16/26* | (2006.01) |
| *G11C 16/30* | (2006.01) |

(52) U.S. Cl.
CPC ............ *G11C 16/14* (2013.01); *G11C 7/1048* (2013.01); *G11C 8/12* (2013.01); *G11C 16/0483* (2013.01); *G11C 16/08* (2013.01); *G11C 16/10* (2013.01); *G11C 16/16* (2013.01); *G11C 16/26* (2013.01); *G11C 16/30* (2013.01)

(58) Field of Classification Search
CPC ............................ G11C 16/0483; G11C 16/10
USPC ........................................ 365/185.12, 185.24
See application file for complete search history.

(56) References Cited

U.S. PATENT DOCUMENTS

| | | | |
|---|---|---|---|
| 6,044,013 A | | 3/2000 | Tanaka et al. |
| 6,067,248 A | * | 5/2000 | Yoo ..................... G11C 11/5621 365/185.03 |
| 6,868,009 B1 | | 3/2005 | Hung et al. |
| 7,400,538 B2 | | 7/2008 | Pikhay et al. |
| 8,085,592 B2 | | 12/2011 | Yun et al. |
| 8,874,874 B2 | | 10/2014 | Wu et al. |
| 2005/0281085 A1 | | 12/2005 | Wu |

(Continued)

OTHER PUBLICATIONS

Office Action issued by the United States Patent and Trademark Office for a parent U.S. Appl. No. 14/686,492 on May 5, 2016.

*Primary Examiner* — Michael Tran
(74) *Attorney, Agent, or Firm* — IP & T Group LLP

(57) ABSTRACT

A semiconductor device includes a plurality of memory blocks including a plurality of memory cells, wherein the plurality of memory cells are divided into a plurality of pages; and an operation circuit configured to output operating voltages to local lines of a selected memory block, among the plurality of memory blocks, to perform a program operation, a read operation and an erase operation on the selected memory block, wherein the operation circuit is configured to apply a dummy pulse having a positive potential to the local lines of the selected memory block after completing the program operation, the read operation and the erase operation.

12 Claims, 14 Drawing Sheets

(56) References Cited

U.S. PATENT DOCUMENTS

| | | |
|---|---|---|
| 2006/0126396 A1 | 6/2006 | Shappir et al. |
| 2007/0036007 A1 | 2/2007 | Lann et al. |
| 2008/0084764 A1 | 4/2008 | Pikhay et al. |
| 2009/0296475 A1 | 12/2009 | Hemink et al. |
| 2011/0078538 A1 | 3/2011 | Ikegawa et al. |
| 2013/0145083 A1* | 6/2013 | Suzuki ................ G06F 12/0246 711/103 |
| 2014/0104955 A1 | 4/2014 | Kwak et al. |

* cited by examiner

SEMICONDUCTOR DEVICE

CROSS-REFERENCE TO RELATED APPLICATION

The present application is a Continuation in Part of U.S. patent application Ser. No. 14/686,492 filed on Apr. 14, 2015 which claims priority to Korean patent application number 10-2014-0160704, filed on Nov. 18, 2014, the entire disclosure of which is herein incorporated in its entirety.

BACKGROUND

Field of Invention

Various exemplary embodiments relate generally to a semiconductor device and, more particularly, to a semiconductor device including a memory cell.

Description of Related Art

A program loop may be performed to store data in a memory cell. A read operation may be performed to read data stored in the memory cell. An erase loop may be performed to erase the data stored in the memory cell. The threshold voltage of the memory cell may be sensed to read the data stored in the memory cell. However, an error may occur due to the threshold voltage of the memory cell being sensed incorrectly when a read operation is performed after the program loop or the erase loop is performed.

SUMMARY

An embodiment is directed to a semiconductor device capable of improving operational reliability and accuracy.

A semiconductor device according to an embodiment of the present invention may include a plurality of memory blocks including a plurality of memory cells, wherein the plurality of memory cells are divided into a plurality of pages; and an operation circuit configured to output operating voltages to local lines of a selected memory block, among the plurality of memory blocks, to perform a program operation, a read operation and an erase operation on the selected memory block, wherein the operation circuit is configured to apply a dummy pulse having a positive potential to the local lines of the selected memory block after completing the program operation, the read operation and the erase operation

DETAILED DESCRIPTION

Figure 1:
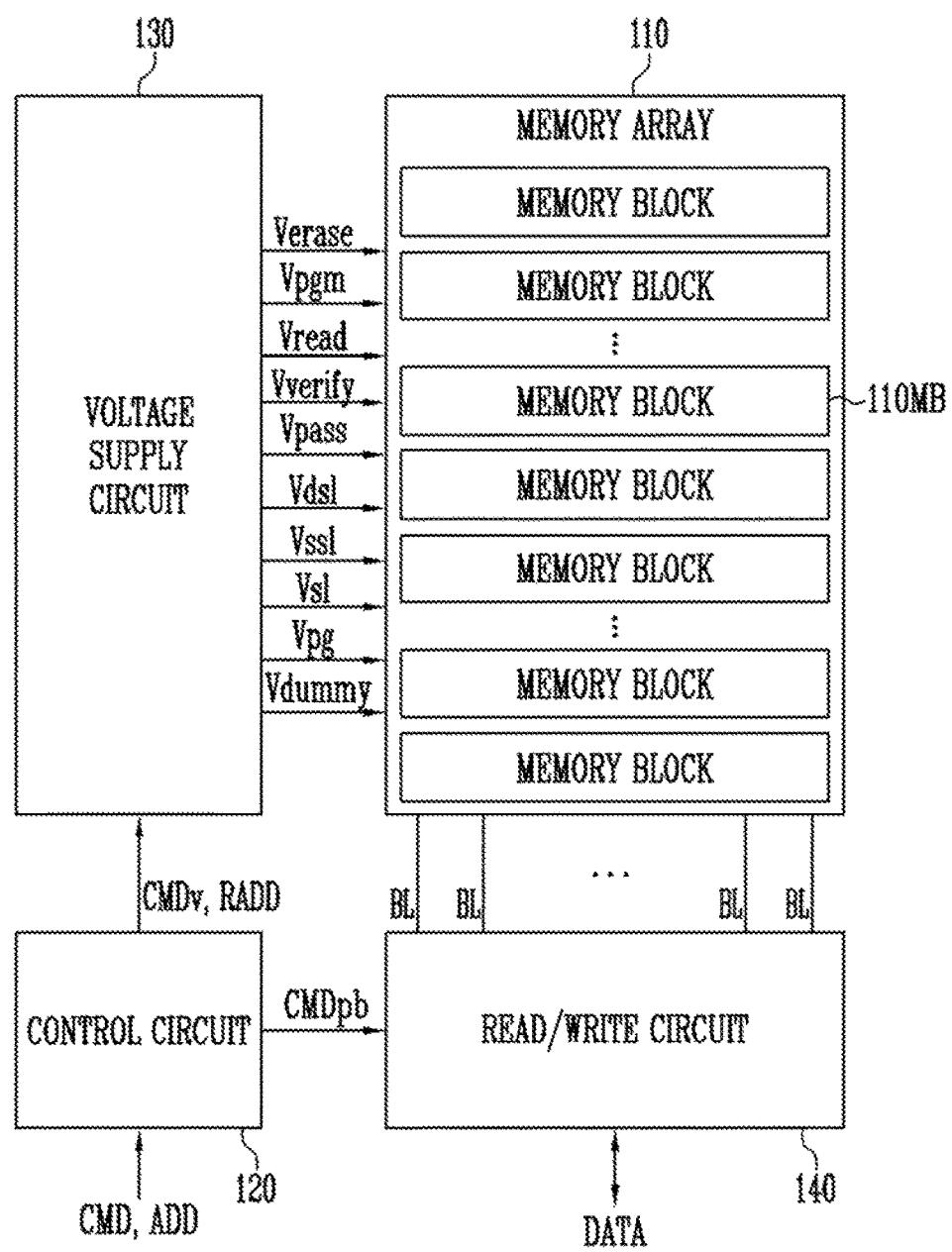
FIG. 1 is a block diagram illustrating a semiconductor device according to an embodiment.

Hereinafter, various exemplary embodiments will be described in detail with reference to the accompanying drawings. In the drawings, thicknesses and lengths of components may be exaggerated for convenience of Illustration. In the following description, a detailed explanation of related functions and constitutions may be omitted for simplicity and conciseness of explanation. Like reference numerals refer to like elements throughout the specification and drawings.

FIG. 1 is a block diagram illustrating a semiconductor device according to an embodiment.

Referring to FIG. 1, the semiconductor device may include a memory array 110 and an operation circuit 120 to 140. The memory array 110 may include a plurality of memory blocks 110MB. Each of the memory blocks 110MB may include a plurality of memory strings. Each of the memory strings may include a plurality of memory cells (not illustrated). In a flash memory device, each memory block may include flash memory cells. Each of the memory cells may include a floating gate including polysilicon or a charge storage layer including a nitride layer.

Each of the memory blocks may include U-shaped memory strings which are coupled to bit lines, respectively, and coupled in parallel with a common source line. The structure of the memory block is described below in detail.

Figure 2A:
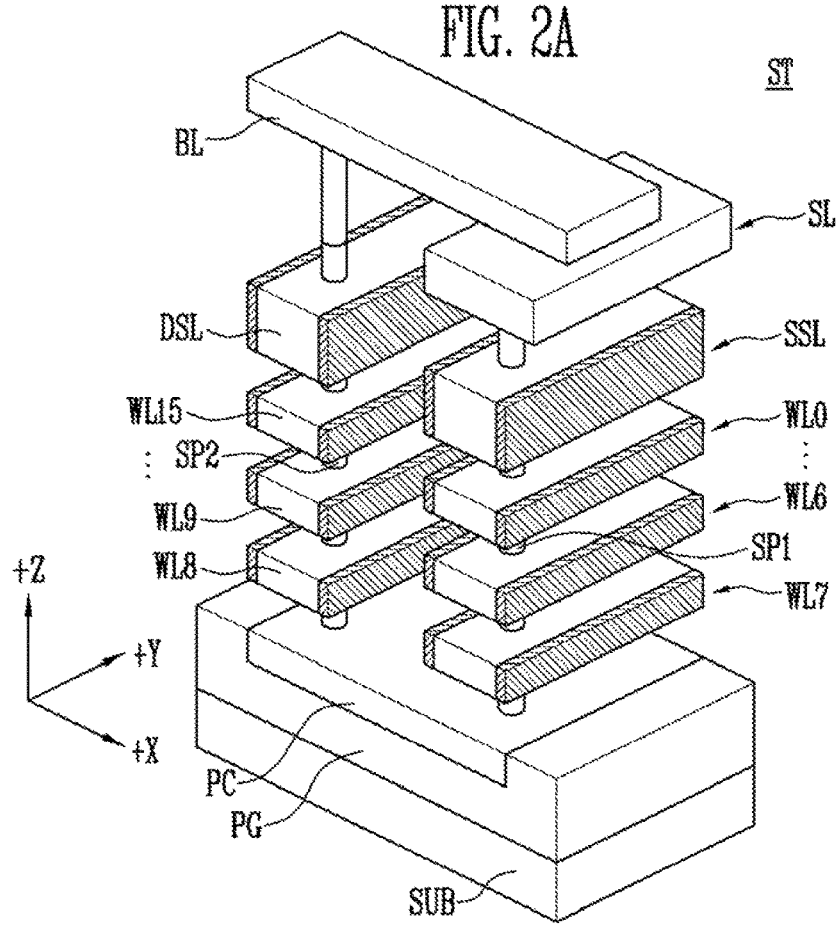
FIGS. 2A to 2C are views illustrating a memory block shown in FIG. 1.
Figure 2B:
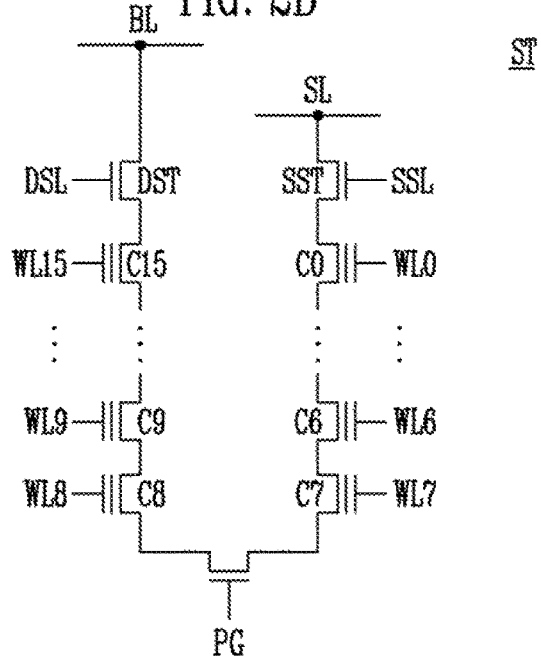
Figure 2C:
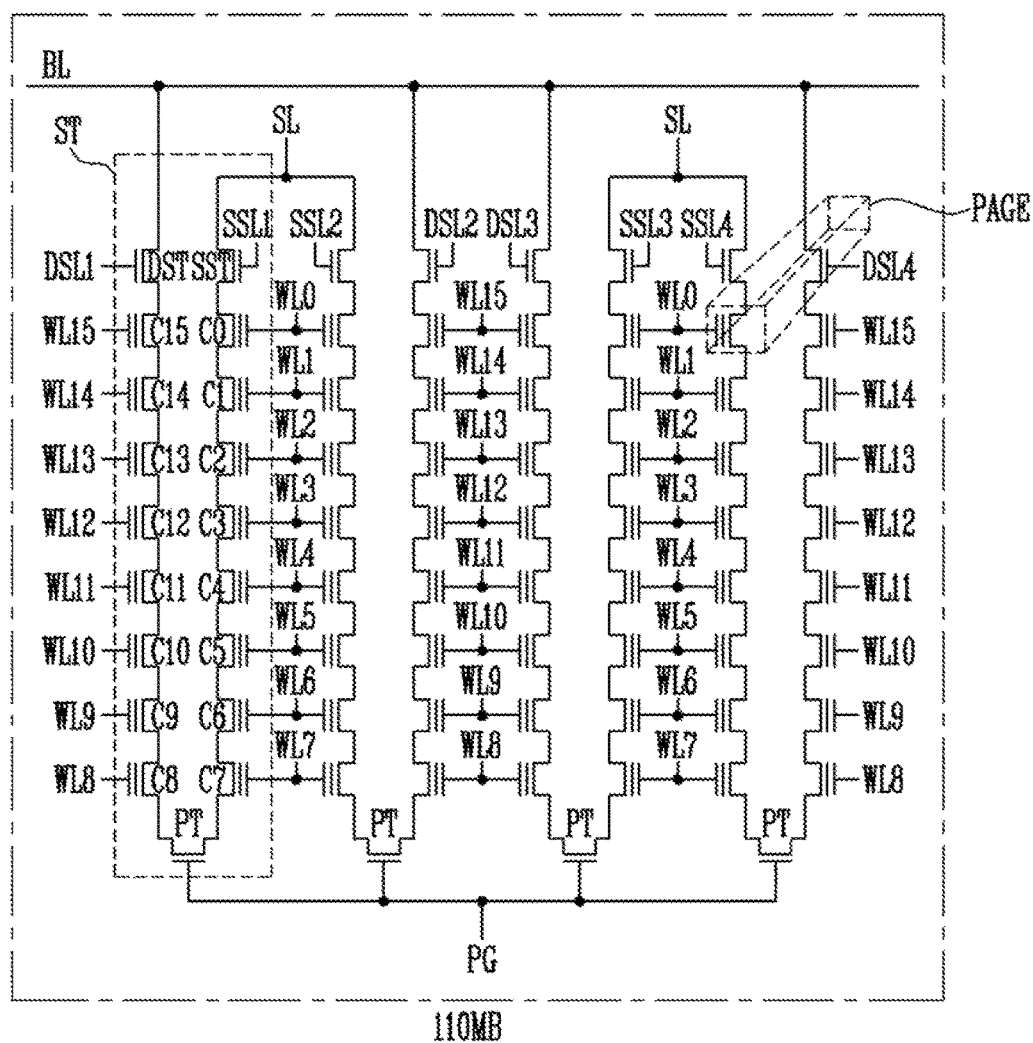

FIGS. 2A to 2C are views illustrating the memory block 110MB of FIG. 1 according to an embodiment. In detail, FIG. 2C is a circuit diagram illustrating the memory block 110MB of FIG. 1, FIG. 2A is a perspective view illustrating a memory string ST included in the memory block 110MB of FIG. 2C, and FIG. 2B is a circuit diagram illustrating the memory string ST of FIG. 2A.

Referring to FIGS. 2A and 2B, a pipe gate PG including a recessed portion may be formed on a semiconductor substrate SUB, and a pipe channel layer PC may be formed in the recessed portion of the pipe gate PG. Vertical channel layers SP1 and SP2 may be formed over the pipe channel layer PC. A top portion of the first vertical channel layer SP1 of a pair of the vertical channel layers SP1 and SP2 may be coupled to a common source line SL. A top portion of the second vertical channel layer SP2 may be coupled to a bit line BL. The vertical channel layers SP1 and SP2 may include polysilicon.

A plurality of conductive layers DSL and WL15 to WL8 may be formed to surround the second vertical channel layer SP2 at different heights. In addition, a plurality of conductive layers SSL and WL0 to WL7 may be formed to surround the first vertical channel layer SP1 at different heights. A multilayer film (not illustrated) including a charge storage layer may be formed on surfaces of the vertical channel layers SP1 and SP2 and a surface of the pipe channel layer PC. The multilayer film may further be formed between the vertical channel layers SP1 and SP2, the conductive layers DSL, WL15 to WL8, SSL, and WL0 to WL7 and between the pipe channel layer PC and the pipe gate PG.

An uppermost conductive layer surrounding the second vertical channel layer SP2 may be a drain selection line DSL, and lower conductive layers under the drain selection line DSL may be word lines WL15 to WL8. An uppermost conductive layer surrounding the first vertical channel layer SP1 may be a source selection line SSL, and lower conductive layers under the source selection line SSL may be word lines WL0 to WL7. Some of the conductive layers serving as the word lines may be dummy word lines (not illustrated).

In other words, first conductive layers SSL and WL0 to WL7 and second conductive layers DSL and WL15 to WL8 may be stacked in different areas of the semiconductor substrate. The first vertical channel layer SP1 passing through the first conductive layers SSL and WL0 to WL7 may be coupled in a vertical direction to the semiconductor substrate SUB between the common source line SL and the pipe channel layer PC. The second vertical channel layer SP2 passing through the second conductive layers DSL and WL15 to WL8 may be coupled in the vertical direction to the semiconductor substrate SUB between the bit line BL and the pipe channel layer PC.

A drain selection transistor DST may be formed where the drain selection line DSL surrounds the second vertical channel layer SP2. Main memory cells C15 to C8 may be formed at positions at which the word lines WL15 to WL8 surround the second vertical channel layer SP2, respectively. A source selection transistor SST may be formed where the source selection line SSL surrounds the first vertical channel layer SP1. Main memory cells C0 to C7 may be formed where word lines WL0 to WL7 surround the first vertical channel layer SP1, respectively.

In the memory block 110MB having the above-described structure, the memory string ST may include the drain selection transistor DST and the main memory cells C15 to C8, which are coupled in the vertical direction to the semiconductor substrate SUB between the bit line BL and the pipe channel layer PC, and the source selection transistor SST and the main memory cells C0 to C7, which are coupled in the vertical direction to the semiconductor substrate SUB between the common source line CSL and the pipe channel layer PC. In addition, a dummy cell transistor (not illustrated) may be further coupled between the selection transistor DST or SST and the main cell transistor C15 or C0, and a dummy cell transistor (not illustrated) may be further coupled between the main cell transistor C8 or C7 and a pipe transistor.

The source selection transistor SST and the main memory cells C0 to C7 coupled between the common source line CSL and the pipe transistor PT may form a first vertical memory string. The drain selection transistor DST and the main memory cells C15 to C8 coupled between the bit line BL and the pipe transistor PT may form a second vertical memory string.

Referring to FIG. 2C, the memory block 110MB may include a plurality of memory strings ST coupled to bit lines BL. Each of the memory strings ST having a U-shaped structure may include the first vertical memory string SST and C0 to C7 coupled in the vertical direction between the common source line SL and the pipe transistor PT in the semiconductor substrate SUB, and the second vertical memory string C8 to C15 and DST coupled in the vertical direction between the bit line BL and the pipe transistor PT in the semiconductor substrate SUB. The first vertical memory string SST and C0 to C7 may include the source selection transistor SST and the memory cells C0 to C7. The source selection transistor SST may be controlled based on a voltage applied to source selection lines SSL1 to SSL4, and the memory cells C0 to C7 may be controlled based on a voltage applied to the stacked word lines WL0 to WL7. The second vertical memory string C8 to C15 and DST may include the drain selection transistor DST and the memory cells C8 to C15. The drain selection transistor DST may be controlled based on a voltage applied to drain selection lines DSL1 to DSL4, and the memory cells C8 to C15 may be controlled based on a voltage applied to the stacked word lines WL8 to WL15.

When the memory block 110MB is selected, the pipe transistor PT coupled between a pair of the memory cells C7 and C8 located in the middle of the memory string having the U-shaped structure may electrically couple channel layers of the first vertical memory string SST and C0 to C7 included in the selected memory block and channel layers of the second vertical memory string C8 to C15 and DST to each other.

In a memory block having a two-dimensional (2D) structure, each of the memory strings may be coupled to each of the bit lines, and drain selection transistors of the memory block may be simultaneously controlled by a single drain selection line. However, in the memory block 110MB having a three-dimensional (3D) structure, the plurality of memory strings ST may be coupled in common to each of the bit lines BL. In the same memory block 110MB, the number of memory strings ST, which are coupled in common to one of the bit lines BL and controlled by the same word lines, may be changed depending on the design.

Since the plurality of memory strings ST are coupled in parallel with the single bit line BL, the drain selection transistors DST may be independently controlled based on selection voltages applied to the drain selection lines DSL1 to DSL4 in order to selectively couple the single bit line BL to the memory strings ST.

The memory cells C0 to C7 of the first vertical memory string SST and C0 to C7 and the memory cells C8 to C15 of the second vertical memory string C8 to C15 and DST which are coupled in the vertical direction in the memory block 110MB may be controlled based on operating voltages applied to the stacked word lines WL0 to WL7 and the stacked word lines WL8 to WL15, respectively. The word lines WL0 to WL15 may be divided into units of memory blocks.

The selection lines DSL1 to DSL4, SSL1 to SSL4 and the word lines WL0 to WL15 may be local lines of the memory block 110MB. The source selection lines SSL1 to SSL4 and the word lines WL0 to WL7 may be local lines of the first vertical memory string, and the word lines WL8 to WL15 and the drain selection lines DSL1 to DSL4 may be local lines of the second vertical memory string. The pipe gates PG of the pipe transistors PT may be coupled in common to each other in the memory block 110MB.

Memory cells coupled to different bit lines and sharing a drain selection line, e.g., DSL4, in the memory block 110MB may form a single page PAGE. The memory block 110MB may be the basic unit for an erase loop, and the page PAGE may be the basic unit for a program loop and a read operation.

Referring again to FIGS. 1 and 2B, the operation circuit 120 to 140 may be configured to perform a program loop, an erase loop and a read operation on the memory cells C0 coupled to a selected word line, e.g., WL0. The program loop may include a program operation and a program verify operation, and the erase loop may include an erase operation and an erase verify operation. After the erase loop, the operation circuit 120 to 140 may perform a program operation (or post-program operation) to control an erase level at which threshold voltages of the memory cells are distributed.

In order to perform the program loop, the erase loop and the read operation, the operation circuit 120 to 140 may be configured to selectively output the operating voltages to local lines SSL, WL0 to WL15, PG, and DSL and the common source line SL of the selected memory block, control precharge/discharge on the bit lines BL, or sense current flow (or voltage variations) on the bit lines BL.

In a NAND flash memory, the operation circuit 120 to 140 may include a control circuit 120, a voltage supply circuit 130 and a read/write circuit 140.

The control circuit 120 may control the voltage supply circuit 130 to generate operating voltages Verase, Vpgm, Vread, Vverify, Vpass, Vdsl, Vssl, Vsl, and Vpg with target levels to perform the program loop, the erase loop and the read operation in response to a command signal CMD which is input from an external device, and apply the operating voltages to the local lines SSL, WL0 to WL15, PG, and DSL and the common source line SL of the selected memory block. The control circuit 120 may receive an address signal ADD and the command signal CMD to output a control signal CMDv and a row address signal RADD to the voltage supply circuit 130. In addition, the control circuit 120 may control the read/write circuit 140 to control precharge/discharge on the bit lines BL, or sense a current flow (or voltage variations) on the bit lines BL during the read operation or the program verify operation in response to data to be stored in the memory cells to perform the program loop, the erase loop and the read operation. The control circuit 120 may output an operation control signal CMDpb to the read/write circuit 140.

The voltage supply circuit 130 may generate the operating voltages necessary to perform the program loop, the erase loop and the read operation on the memory cells in response to the control signal CMDv from the control circuit 120. The operating voltages may include an erase voltage Verase, a program voltage Vpgm, a read voltage Vread, a verify voltage Vverify, a pass voltage Vpass, selection voltages Vdsl and Vssl, a common source voltage Vsl, and a pipe gate voltage Vpg. In addition, the voltage supply circuit 130 may output the operating voltages to the local lines SSL, WL0 to WL15, PG, and DSL and the common source line SL of the selected memory block 110MB in response to the row address signal RADD from the control circuit 120.

The read/write circuit 140 may include a plurality of page buffers (not illustrated) coupled to the memory array 110 through the bit lines BL. More specifically, each of the page buffers may be coupled to each of the bit lines BL. In other words, the page buffers may be coupled to the bit lines one to one. During the program operation, in response to the operation control signal CMDpb from the control circuit 120 and data DATA to be stored in the memory cells, the page buffers may selectively precharge the bit lines BL. The control circuit 120 may control the page buffers to precharge the bit lines BL, sense voltage variations or current on the bit lines BL, and latch data read from the memory cells during the program verify operation or the read operation.

Figure 3:
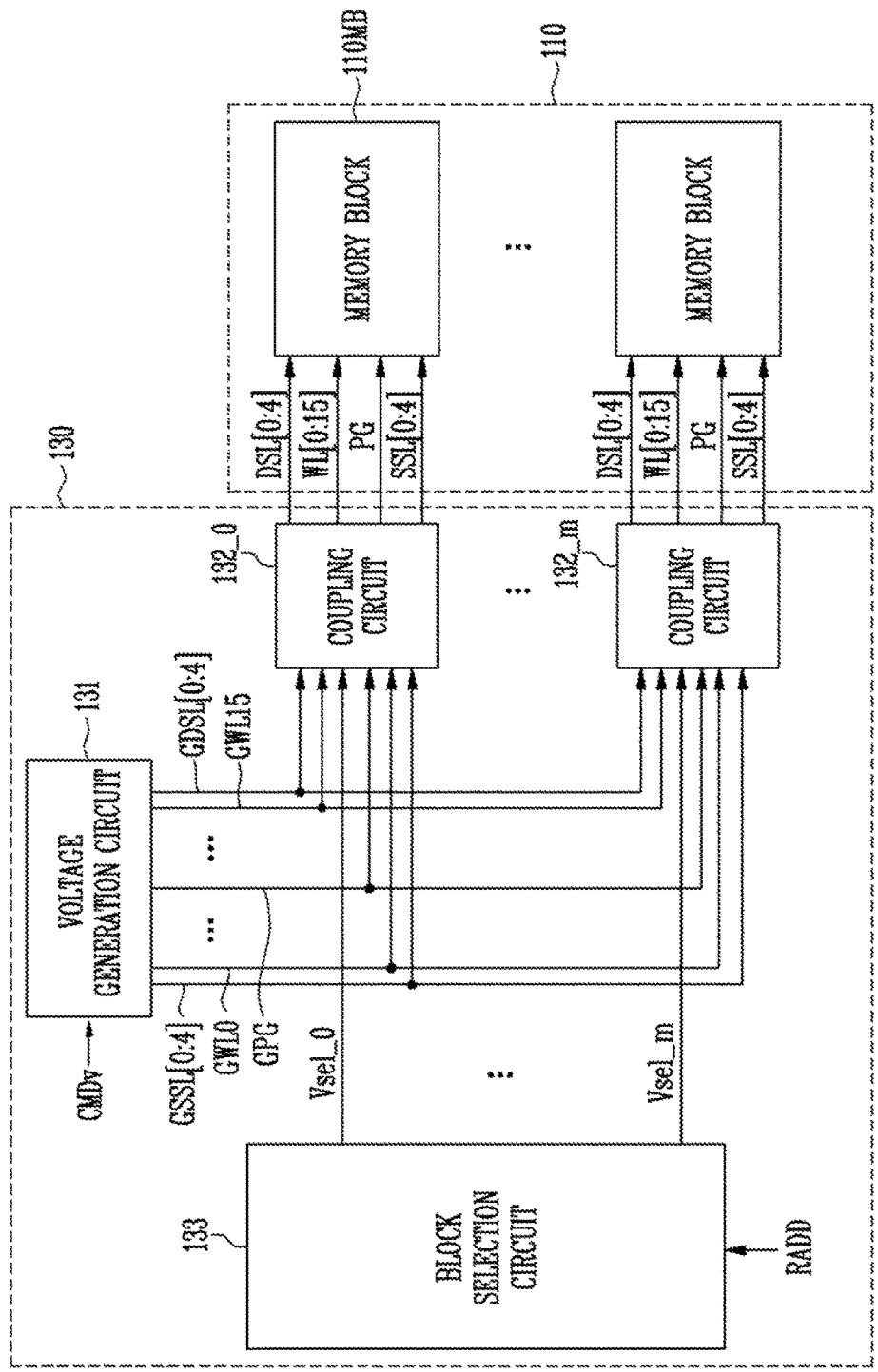
FIG. 3 is a detailed block diagram illustrating a voltage supply circuit shown in FIG. 1.

FIG. 3 is a detailed block diagram illustrating the voltage supply circuit 130 shown in FIG. 1.

Referring to FIG. 3, the voltage supply circuit 130 of the semiconductor device may include a voltage generation circuit 131, coupling circuits 132_0 to 132_m and a block selection circuit 133. The memory blocks 110MB of the memory array 110 may be the memory block described above with reference to FIGS. 2A to 2C.

The voltage generation circuit 131 may be configured to output the operating voltages to global lines GSSL[0:4], GWL0 to GWL15, GPG, and GDSL[0:4]. For example, the voltage generation circuit 131 may output the operating voltages necessary to perform the program loop, the read operation, and the erase loop on the memory cells to the global lines GSSL[0:4], GWL0 to GWL15, GPG, and GDSL[0:4].

The coupling circuits 132_0 to 132_m may be coupled between the global lines GSSL[0:4], GWL0 to GWL15, GPG, and GDSL[0:4] and local lines SSL[0:4], WL0 to WL15, PG, and DSL[0:4] of the memory blocks 110MB, and operate in response to block selection signals Vsel_0 to Vsel_m from the block selection circuit 133. In other words, the coupling circuits 132_0 to 132_m may selectively couple the global lines GSSL[0:4], GWL0 to GWL15, GPG, and GDSL[0:4] to the local lines SSL[0:4], WL0 to WL15, PG, and DSL[0:4] of the selected memory block 110MB, respectively, in response to the block selection signals Vsel_0 to Vsel_m from the block selection circuit 133 so that the operating voltages, e.g., the erase voltage Verase, the program voltage Vpgm, the read voltage Vread, the verify voltage Vverify, the pass voltage Vpass, the selection voltages Vdsl and Vssl, the common source voltage Vsl, and the pipe gate voltage Vpg of FIG. 1, which are output to the global lines GSSL[0:4], GWL0 to GWL15, GPG, and GDSL[0:4] from the voltage generation circuit 131 may be transferred to the local lines SSL[0:4], WL0 to WL15, PG, and DSL[0:4] of the selected memory block 110MB, respectively.

The coupling circuits 132_0 to 132_m may further include transistors (not illustrated) coupled between the global lines GSSL[0:4], GWL0 to GWL15, GPG, and GDSL[0:4] and the local lines SSL[0:4], WL0 to WL15, PG, and DSL[0:4] of the memory blocks 110MB.

In the flash memory device, each of the coupling circuits 132_0 to 132_m may correspond to each of the memory blocks 110MB, and the coupling circuits 132_0 to 132_m may selectively operate in response to the block selection signals Vsel_0 to Vsel_m of the block selection circuit 133. For example, only the coupling circuit selected in response to the block selection signals Vsel_0 to Vsel_m, among the coupling circuits 132_0 to 132_m, may be selectively operated.

The block selection circuit 133 may output the block selection signals Vsel_0 to Vsel_m to the coupling circuits 132_0 to 132_m, respectively, in response to the row address signal RADD. In response to the row address signal RADD, one of the block selection signals Vsel_0 to Vsel_m may be activated, and the other block selection signals may be deactivated. The coupling circuit 132_0 receiving the activated block selection signal Vsel_0 may transfer the operating voltages output to the global lines GSSL[0:4], GWL0 to GWL15, GPG, and GDSL[0:4] to the selected memory block 110MB without voltage drop. The coupling circuits 132_m receiving the deactivated block selection signals Vsel_m may block the operating voltages output to the global lines GSSL[0:4], GWL0 to GWL15, GPG, and GDSL[0:4] from being transferred to the selected memory block 110MB.

Referring to FIGS. 1 and 3, the operation circuit 120 to 140 may apply a dummy pulse Vdummy having a positive potential to the local lines SSL[0:4], WL0 to WL15, PG, and DSL[0:4] of all memory blocks 110MB after the program loop or the erase loop is completed. In addition, before performing the read operation, the operation circuit 120 to 140 may apply the dummy pulse Vdummy having the positive potential to the local lines SSL[0:4], WL0 to WL15, PG, and DSL[0:4] of all memory blocks or the selected memory block 110MB.

More specifically, the voltage generation circuit 131 may output the dummy pulse Vdummy to the global lines GSSL[0:4], GWL0 to GWL15, GPG, and GDSL[0:4] in response to the control signal CMDv from the control circuit 120, and the block selection circuit 133 may activate all block selection signals Vsel_0 to Vsel_m in response to the row address signal RADD from the control circuit 120. The coupling circuits 132_0 to 132_m may couple the local lines SSL[0:4], WL0 to WL15, PG, and DSL[0:4] of all memory blocks 110MB to the global lines GSSL[0:4], GWL0 to GWL15, GPG, and GDSL[0:4] in response to the activated block selection signals Vsel_0 to Vsel_m. As a result, the dummy pulse Vdummy may be applied to the local lines SSL[0:4], WL0 to WL15, PG, and DSL[0:4] of all memory blocks 110MB.

In another example, the block selection circuit 133 may activate a single block selection signal, e.g., Vsel_0, in response to the row address signal RADD from the control circuit 120. The coupling circuits 132_0 may couple the local lines SSL[0:4], WL0 to WL15, PG, and DSL[0:4] of the selected memory block 110MB to the global lines GSSL[0:4], GWL0 to GWL15, GPG, and GDSL[0:4] to perform the read operation in response to the activated block selection signals Vsel_0. As a result, the dummy pulse Vdummy may be applied to only the local lines SSL[0:4], WL0 to WL15, PG, and DSL[0:4] of the memory blocks 110MB selected to perform the read operation.

When applying the dummy pulse Vdummy, the operation circuit 120 to 140 may apply a ground voltage of 0V to the bit lines BL and the common source line SL, as shown in FIG. 2B, of the memory blocks 110MB.

By applying the dummy pulse Vdummy under the above-described conditions, errors may be prevented from occurring during the read operation due to initialization of the channel region of the memory cells.

Operations of the semiconductor device having the above-described components are described below.

FIGS. 4 to 10 are flowcharts illustrating a method of operating a semiconductor device according to an embodiment.

Figure 4:
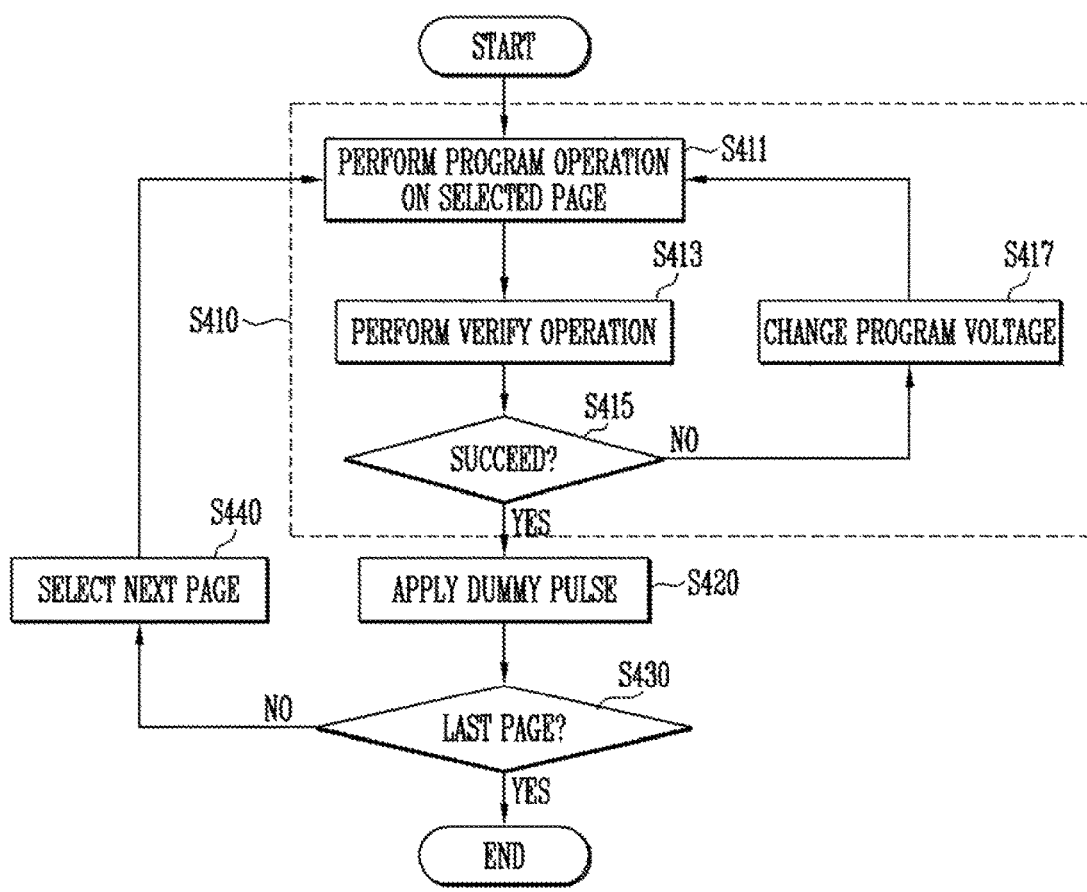
FIGS. 4 to 10 are flowcharts illustrating a method of operating a semiconductor device according to an embodiment.

Referring to FIGS. 1, 3 and 4, a program loop of a selected page may be performed at step S410. The program loop may include a program operation and a program verify operation and be performed using an Increment Step Pulse Program (ISPP) method.

More specifically, the program operation may be performed on the selected page at step S411. When a program command of the command signal CMD, the address signal ADD and the data DATA are input, the read/write circuit 140 may apply a program permission voltage of 0V to the bit lines BL of memory cells in which program data are stored, and apply a program inhibition voltage of a supply voltage to the bit lines BL of memory cells in which erase data are stored.

The voltage generation circuit 131 of the voltage supply circuit 130 may output the selection voltages Vssl and Vdsl to the global selection lines GDSL[0:4] and GSSL[0:4], output the pipe gate voltage Vpg to the global pipe gate line GPG, output the program voltage Vpgm to the global word line, e.g., GWL0, of the selected page, and output the pass voltage Vpass to the remaining global word lines in response to the control signal CMDv from the control circuit 120.

The block selection circuit 133 of the voltage supply circuit 130 may activate the block selection signal, e.g., Vsel_0, corresponding to the memory block including the selected page in response to the row address signal RADD from the control circuit 120. The coupling circuits 132_0 may couple the local lines SSL[0:4], WL0 to WL15, PG, and DSL[0:4] of the selected memory block 110MB to the global lines GSSL[0:4], GWL0 to GWL15, GPG, and GDSL[0:4] in response to the activated block selection signal Vsel_0.

As a result, the program operation may be performed on the memory cells included in the selected page, i.e., memory cells coupled to a word line to which the program voltage Vpgm is applied.

At step S413, the program verify operation may be performed on the memory cells on which the program operation is performed. The read/write circuit 140 may precharge the bit lines BL to perform the program verify operation.

The voltage generation circuit 131 of the voltage supply circuit 130 may output the selection voltages Vssl and Vdsl to the global selection lines GDSL[0:4] and GSSL[0:4], respectively, output the pipe gate voltage Vpg to the global pipe gate line GPG, output the program verify voltage Vverify to the global word line, e.g., GWL0, of the selected page, and output the pass voltage Vpass to the remaining global word lines in response to the control signal CMDv from the control circuit 120. These voltages may be applied to the local lines SSL[0:4], WL0 to WL15, PG, and DSL [0:4] of the selected memory block 110MB coupled to the global lines GSSL[0:4], GWL0 to GWL15, GPG, and GDSL[0:4] through the coupling circuit 132_0.

The read/write circuit 140 may sense voltage variations on the bit lines BL and store a sensing result in a latch circuit therein.

The control circuit 120 may determine whether the program operation succeeds or fails, depending on the sensing result stored in the read/write circuit 140 at step S415. When the number of memory cells in which data are not stored is greater than a preset number at step S415 (NO), the program operation may be determined to be failed. When the program operation fails, the voltage supply circuit 130 may increase the program voltage Vpgm by a predetermined level in response to the control signal CMDv from the control circuit 120 at step S417. In addition, the voltage supply circuit 130 may perform the program operation again based on the program voltage Vpgm which is increased at step S417.

When it is determined that the program operation succeeds at step S415 (YES) since the data DATA are normally stored in the memory cells, the dummy pulse Vdummy may be applied at step S420.

The voltage generation circuit 131 of the voltage supply circuit 130 may output the dummy pulse Vdummy to all global lines GSSL[0:4], GWL0 to GWL15, GPG, and GDSL[0:4]. The block selection circuit 133 may activate all block selection signals Vsel_0 to Vsel_m. As a result, the local lines SSL[0:4], WL0 to WL15, PG, and DSL[0:4] of the memory blocks 110MB may be coupled to the global lines GSSL[0:4], GWL0 to GWL15, GPG, and GDSL[0:4] through the coupling circuits 132_0 to 132_m.

Thus, the dummy pulse Vdummy may be applied to the local lines SSL[0:4], WL0 to WL15, PG, and DSL[0:4] of all memory blocks 110MB. The ground voltage of 0V may be applied to the common source line SL and the bit lines BL by the voltage supply circuit 130 and the read/write circuit 140.

Charges abnormally remaining in the channel region of the memory cells by the program loop may be discharged to the bit lines BL or the common source line SL by the dummy pulse Vdummy, so that the channel region may be initialized. As a result, even when a read operation is performed, a sensing error of a threshold voltage may be prevented, and reliability may be improved.

At step S430, it may be determined whether the page on which the program loop is completed is the last page. When it is not the last page at step S430 (NO), the control circuit 120 may change the row address signal RADD so that the next page may be selected at step S440. Subsequently, steps S410 to S430 may be repeated. When the page on which the program loop is completed is the last page at step S430 (YES), all operations may be completed.

The last page at step S430 may be the last page of all pages included in the selected memory block, or a page set by the user, among all pages included in the selected memory block. Therefore, a program operation may be sequentially performed on an entirety of pages included in the selected memory block, or a program operation may be sequentially performed on a portion of pages.

As described above, whenever the program loop of the memory cells included in the selected page is completed, the dummy pulse Vdummy may be output to the local lines SSL[0:4], WL0 to WL15, PG, and DSL[0:4] of the memory blocks 110MB. However, the dummy pulse Vdummy may be applied once to the local lines SSL[0:4], WL0 to WL15, PG, and DSL[0:4] of the memory blocks after all program loops of selected pages are completed.

Figure 5:
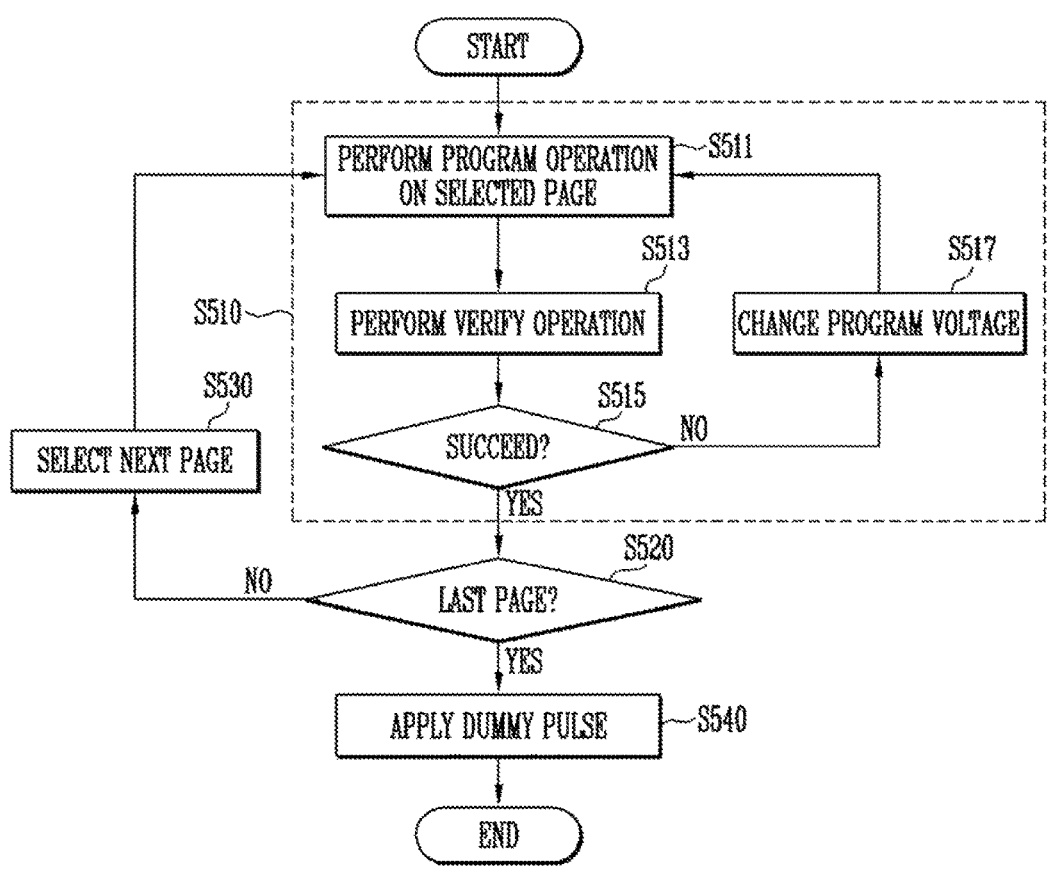

Referring to FIGS. 1, 3, and 5, a program loop may be performed on a selected page at step S510. The program loop may be performed using an Increment Step Pulse Program (ISPP) method. The program loop at step S510 may be performed in substantially the same manner as the program loop at step S410 described above in FIG. 4.

It may be determined whether the page on which the program loop is completed is the last page at step S520. When it is not the last page at step S520 (NO), the control circuit 120 may change the row address signal RADD so that the next page may be selected at step S530. Subsequently, steps S510 and S520 may be repeated.

The last page at step S520 may be the last page of all pages included in the selected memory block, or a page set by the user, among all pages included in the selected memory block. Therefore, a program operation may be sequentially performed on an entirety of pages included in the selected memory block, or a program operation may be sequentially performed on a portion of pages.

When the page on which the program loop is completed is the last page at step S520 (YES), the dummy pulse Vdummy may be applied at step S540. The dummy pulse Vdummy may be applied in substantially the same manner as the step S420 described above in FIG. 4.

As described above, the dummy pulse Vdummy may be output to the local lines SSL[0:4], WL0 to WL15, PG, and DSL[0:4] of the memory blocks 110MB after all program loops of memory cells included in a plurality of pages are completed. However, when a read command is input before all program loops are completed, the operation circuit 120 to 140 may stop performing the program loops on the pages, apply the dummy pulse Vdummy having the positive potential to local lines of the memory blocks, and perform a read operation. After completing the read operation, the operation circuit 120 to 140 may resume the program loops of the selected page.

Figure 6:
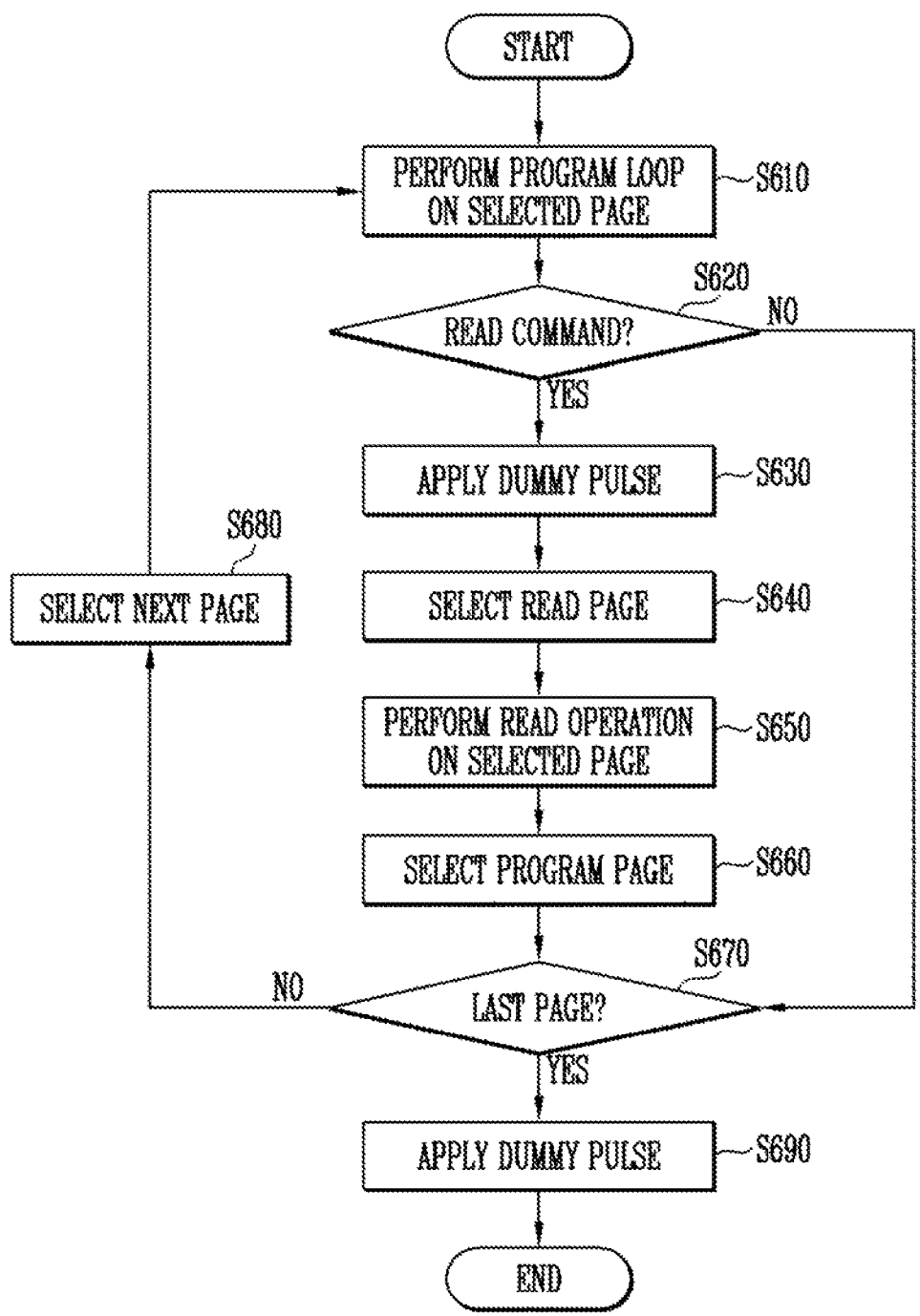

More specifically, referring to FIGS. 1, 3 and 6, a program loop may be performed on a selected page at step S610. The program loop may be performed using an Increment Step Pulse Program (ISPP) method. The program loop at S610 may be performed in substantially the same manner as the program loop at step S410 described above in FIG. 4.

After the program loop of the selected page is completed at step S610, it may be checked whether a read command is input at step S620. When it is checked that the read command is not input at step S620 (NO), it may be determined whether the page on which the program loop is completed is the last page at step S670.

When it is checked that the read command of the command signal CMD and the address signal ADD are input at step S620 (YES), the dummy pulse Vdummy may be applied at step S630. The dummy pulse Vdummy may be applied in substantially the same manner as the step S420 described above in FIG. 4.

Subsequently, a page on which a read operation is performed may be selected in response to the address signal ADD at step S640. For example, the control circuit 120 may store a program address signal of the page on which the program loop is completed at step S610, in a register therein, and output the row address signal RADD of the page on which the read operation is performed in response to a read address signal.

The operation circuit 120 to 140 may perform the read operation on the selected page at step S650. The read/write circuit 140 may precharge the bit lines BL to perform the read operation.

The block selection circuit 133 of the voltage supply circuit 130 may activate the block selection signal, e.g., Vsel_m, of the memory block including the selected page in response to the row address signal RADD from the control circuit 120. The coupling circuit 132_m may couple the local lines SSL[0:4], WL0 to WL15, PG, and DSL[0:4] of the selected memory block 110MB to the global lines GSSL[0:4], GWL0 to GWL15, GPG, and GDSL[0:4] in response to the activated block selection signal Vsel_m.

The voltage generation circuit 131 of the voltage supply circuit 130 may output the selection voltages Vssl and Vdsl to the global selection lines GDSL[0:4] and GSSL[0:4], respectively, the pipe gate voltage Vpg to the global pipe gate line GPG, output the read voltage Vread to the global word line, e.g., GWL0, of the selected page, and output the pass voltage Vpass to the remaining global word lines in response to the control signal CMDv from the control circuit 120.

These voltages may be applied to the local lines SSL[0:4], WL0 to WL15, PG, and DSL[0:4] of the selected memory block 110MB coupled to the global lines GSSL[0:4], GWL0 to GWL15, GPG, and GDSL[0:4] through the coupling circuit 132_m.

The read/write circuit 140 may sense voltage variations on the bit lines BL and store a sensing result in a latch circuit therein. Subsequently, the read/write circuit 140 may output the data DATA stored in the latch circuit.

When the read operation is completed, the page on which the program loop is completed may be selected at step S660. For example, the control circuit 120 may change the row address signal RADD based on the program address signal stored in the register therein at step S640.

It may be determined whether the page on which the program loop is completed is the last page at step S670. When it is not the last page at step S670 (NO), the control circuit 120 may change the row address signal RADD so that the next page may be selected at step S680. Subsequently, steps S610 to S670 may be repeated.

When the page on which the program loop is completed is the last page at step S670 (YES), the dummy pulse Vdummy may be applied at step S690. The dummy pulse Vdummy may be applied in substantially the same manner as the step S420 described above in FIG. 4.

A method of applying a dummy pulse when an erase loop is performed is described below.

Figure 7:
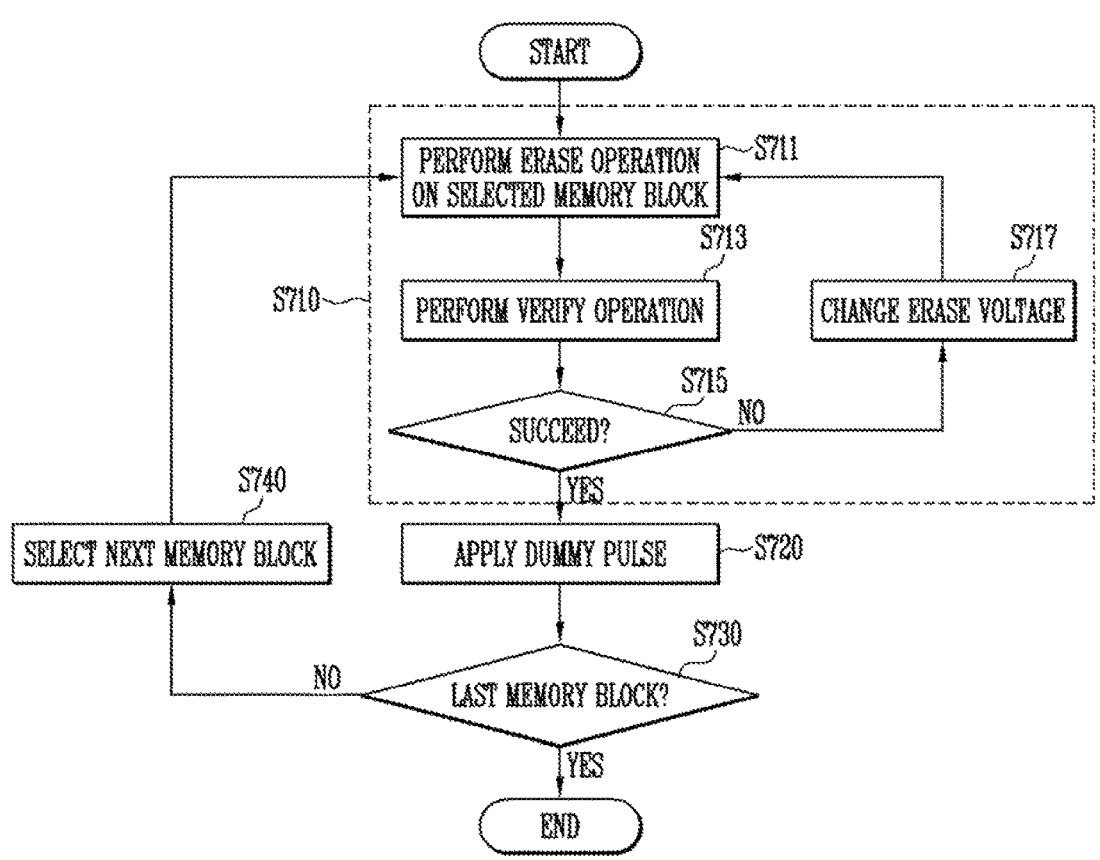

Referring to FIGS. 1, 3 and 7, an erase loop of a selected memory block may be performed at step S710. The erase loop may include an erase operation and an erase verify operation, and be performed using an Increment Step Pulse Erase (ISPE) method.

More specifically, the erase operation may be performed on the selected memory block at step S711. Since an erase operation of a three-dimensionally structured memory block including a U-shaped memory string is performed by a well-known method, a detailed description thereof is omitted.

The erase verify operation may be performed on memory cells of the memory block on which the erase operation is performed at step S713. The erase verify operation may be performed in substantially the same manner as the program verify operation at step S413 described above in FIG. 4. However, the voltage generation circuit 131 of the voltage supply circuit 130 may output the erase verify voltage Vverify to the global word lines GWL0 to GWLn in response to the control signal CMDv from the control circuit 120.

At step S715, the control circuit 120 may determine whether the erase operation succeeds or fails, depending on a result of the erase verify operation at step S713. The erase operation may be determined to fail at step S715 (NO) when the number of memory cells which are not erased is greater than a preset number. When the erase operation fails, the voltage supply circuit 130 may change the erase voltage Verase by a predetermined level in response to the control signal CMDv from the control circuit 120 at step S717. In addition, the erase operation may be performed again based on the erase voltage Verase which is changed at step S717.

When the erase operation of the memory block is determined to succeed at step S715 (YES), the dummy pulse Vdummy may be applied at step S720. The dummy pulse Vdummy may be applied in substantially the same manner as the step S420 in FIG. 4.

Charges abnormally remaining in the channel region of the memory cells by the erase loop may be discharged to the bit lines BL or the common source line SL by the dummy pulse Vdummy, so that the channel region may be initialized. Therefore, even when a read operation is performed, a sensing error of a threshold voltage may be prevented, and reliability may be improved.

It may be checked whether the memory block on which the erase loop is completed is the last memory block at step S730. When it is not the last memory block at step 730 (NO), the control circuit 120 may change the row address signal RADD so that the next memory block may be selected at step S740. Subsequently, steps S710 to S730 may be repeated. The operations may be completed when it is determined that the memory block on which the erase loops are completed is the last memory block at step S730 (YES).

As described above, whenever the erase loop of the selected memory block is completed, the dummy pulse Vdummy may be output to the local lines SSL[0:4], WL0 to WL15, PG, and DSL[0:4] of the memory blocks 110MB. However, the dummy pulse Vdummy may be output once to the local lines SSL[0:4], WL0 to WL15, PG, and DSL[0:4] of the memory blocks, after all erase loops of the selected memory blocks are completed.

Figure 8:
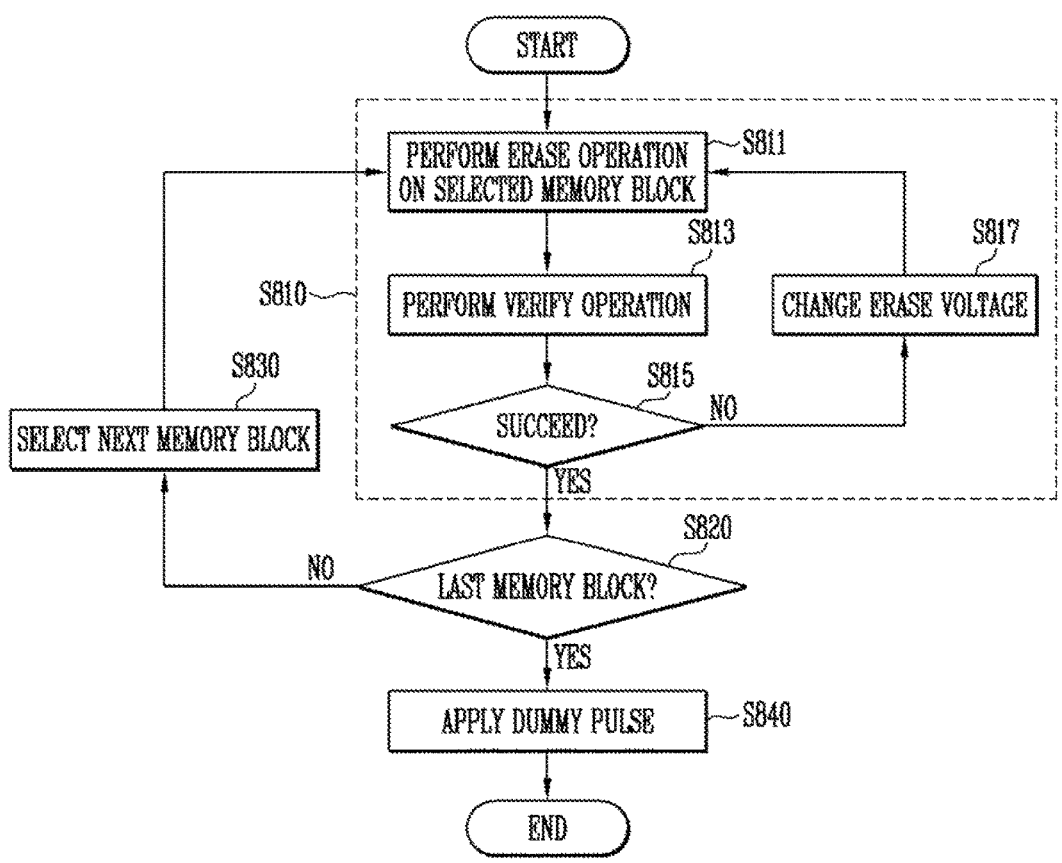

Referring to FIGS. 1, 3 and 8, an erase loop may be performed on a selected memory block at step S810. The erase loop at step S810 may be performed in substantially the same manner as the erase loop described above at step S710 in FIG. 7.

It may be determined whether the memory block on which the erase loop is completed is the last memory block at step S820. In other words, it may be determined whether all erase loops of selected memory blocks are completed. When it is not the last memory block, i.e., when a memory block to be erased remains at step S820 (NO), the control circuit 120 may change the row address signal RADD to select the next memory block at step S830. Subsequently, steps S810 and S820 may be repeated.

When the memory block on which the erase loop is completed is the last memory block, i.e., when the erase loops of the selected memory blocks are completed at step S820 (YES), the dummy pulse Vdummy may be applied at step S840. The dummy pulse Vdummy may be applied in substantially the same manner as the step S420 in FIG. 4.

As described above, the dummy pulse Vdummy may be output to the local lines SSL[0:4], WL0 to WL15, PG, and DSL[0:4] of the memory blocks 110MB after all erase loops of a plurality of memory blocks are completed. However, the operation circuit 120 to 140 may stop performing the erase loops on designated memory blocks when a read command is input before the erase loops are completed, apply the dummy pulse Vdummy having a positive potential to local lines of the memory blocks, and perform a read operation. The operation circuit 120 to 140 may resume the erase loops of the designated memory blocks after completing the read operation.

Figure 9:
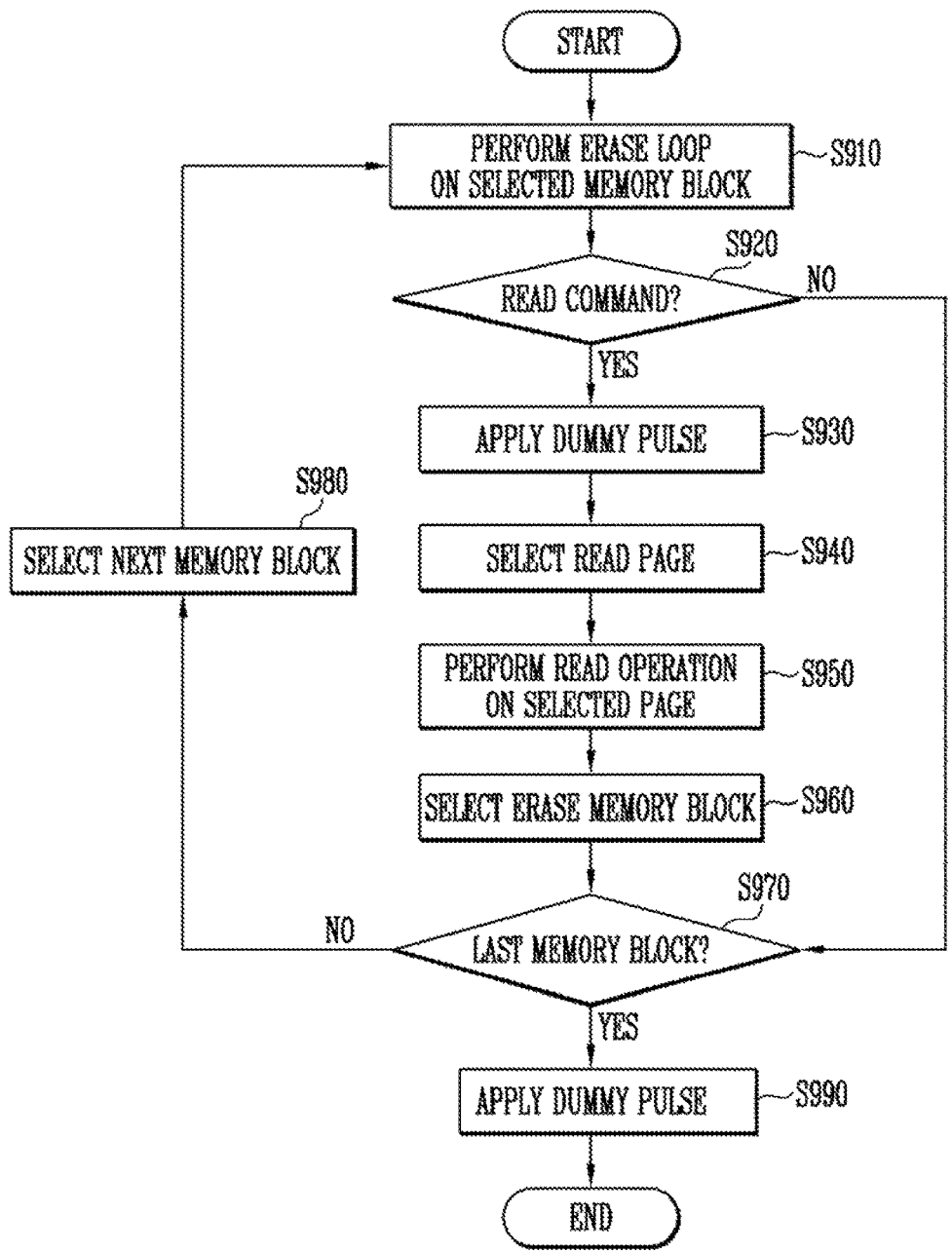

More specifically, referring to FIGS. 1, 3 and 9, an erase loop may be performed on a selected memory block at step S910. The erase loop may be performed in substantially the same manner as the program loop described above at step S710 in FIG. 7.

After the erase loop of the selected memory block is completed at step S910, it may be checked whether a read command is input at step S920. When it is checked that the read command is not input at step 920 (NO), it may be determined whether the memory block on which the erase loop is completed is the last memory block at step S970. In other words, it may be checked whether the erase loops of all designated memory blocks are completed.

When the read command of the command signal CMD and the address signal ADD are input at step S920, the dummy pulse Vdummy may be applied at step S930. The dummy pulse Vdummy may be applied in substantially the same manner as the step S420 described above in FIG. 4.

Subsequently, a page on which a read operation is performed may be selected in response to the address signal ADD at step S940. For example, the control circuit 120 may store an erase address signal of the memory block, on which the erase loop is completed at step S910, in the register therein, and output the row address signal RADD of the page on which the read operation is performed in response to a read address signal.

The operation circuit 120 to 140 may perform the read operation on the selected page at step S950. The read operation may be performed in substantially the same manner as the read operation at step 650 described above in FIG. 6.

When the read operation is completed, the memory block on which the erase loop is completed may be selected at step S960. For example, the control circuit 120 may change the row address signal RADD based on the erase address signal stored in the register at step S940.

It may be determined whether the memory block on which the erase loop is completed is the last memory block at step S970. In other words, it may be checked whether the erase loops of the designated memory blocks are completed. When it is not the last memory block and there remains a memory block on which the erase loop is performed at step S970 (NO), the control circuit 120 may change the row address signal RADD to select the next memory block at step S980. Subsequently, steps S910 to S970 may be repeated.

When the memory block on which the erase loop is completed is the last memory block, among the designated memory blocks, and there is no memory block on which an erase loop is to be performed at step S970 (YES), the dummy pulse Vdummy may be applied in substantially the same manner as the step S420 in FIG. 4.

An operation of applying the dummy pulse Vdummy when a read operation is performed is described below.

Figure 10:
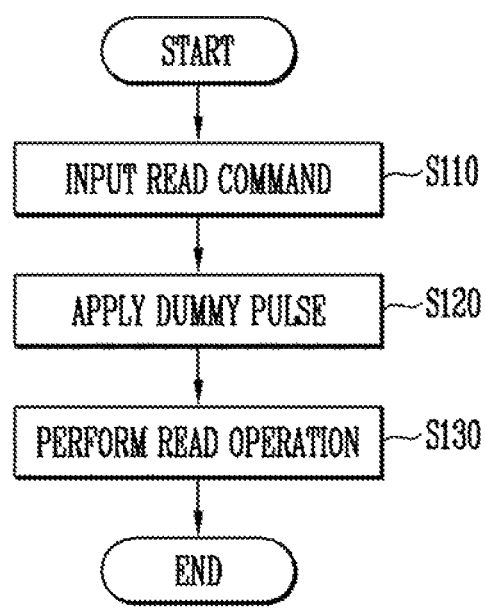

Referring to FIGS. 1, 3 and 10, the read command of the command signal CMD may be input at step S110. The address signal ADD may also be input.

The dummy pulse Vdummy may be applied at step S120. The dummy pulse may be applied in substantially the same method as step S420 in FIG. 4.

A read operation may be performed at step S130. The operation circuit 120 to 140 may perform the read operation in substantially the same manner as the read operation at step S640, described above in FIG. 6.

When a predetermined period of time passes after the program loop or the erase loop is performed, the operation of applying the dummy pulse Vdummy may be skipped.

Figure 11:
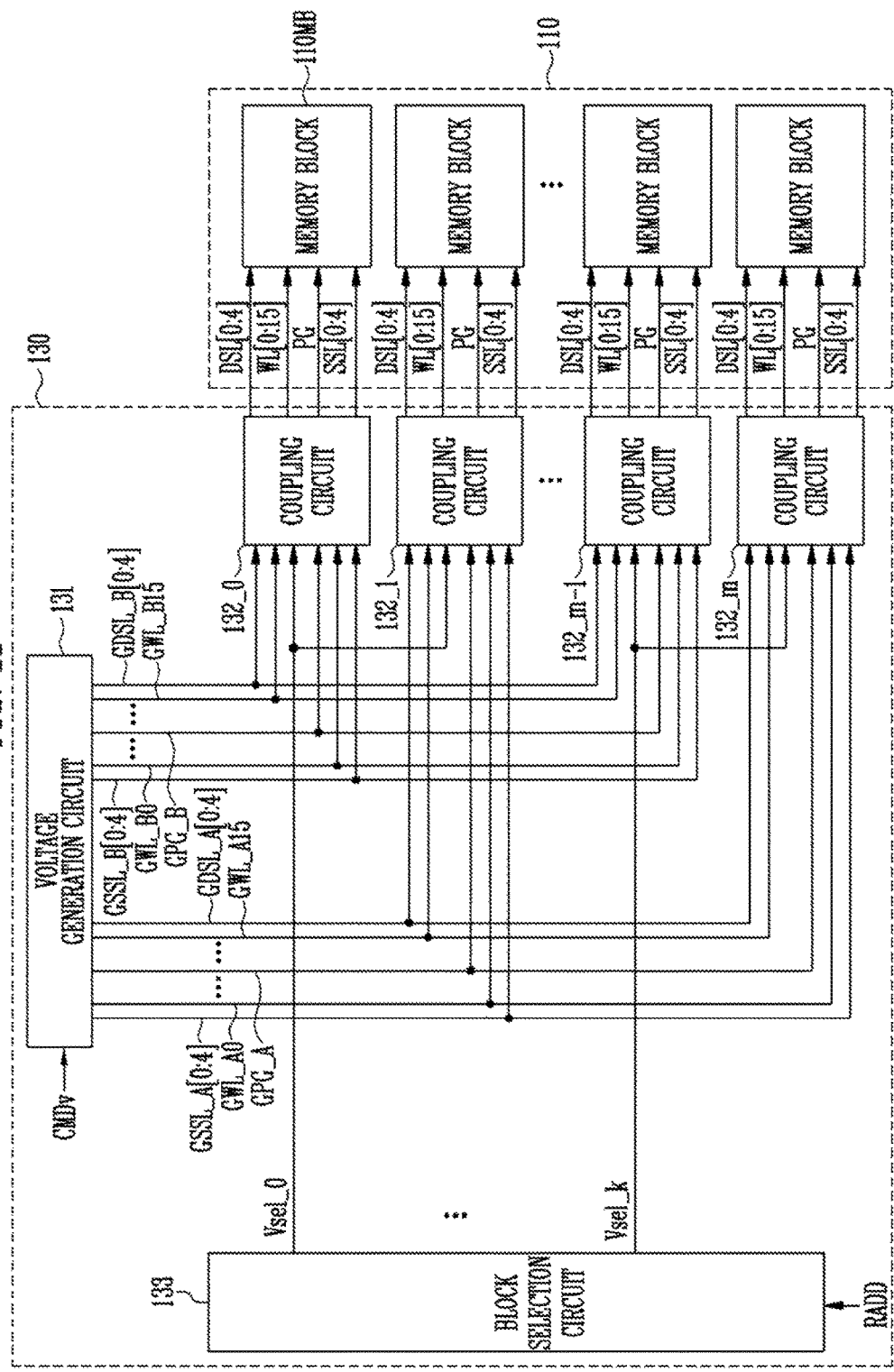
FIG. 11 is a block diagram illustrating a voltage supply circuit according to another embodiment.

FIG. 11 is a block diagram illustrating a voltage supply circuit according to another embodiment.

Referring to FIG. 11, the voltage supply circuit 130 of the semiconductor device may include the voltage generation circuit 131, the coupling circuits 132_0 to 132_m and the block selection circuit 133. The memory blocks 110MB of the memory array 110 may be the memory blocks described with reference to FIGS. 2A to 2C.

The voltage generation circuit 131 may be configured to output operating voltages to first global lines GSSL_A[0:4], GWL_A0 to GWL_A15, GPG_A, and GDSL_A[0:4] or second global lines GSSL_B[0:4], GWL_B0 to GWL_B15, GPG_B, and GDSL_B[0:4] in response to a signal CMDv from the control circuit. For example, the voltage generation circuit 131 may output operating voltages for a program loop, a read operation and an erase loop on memory cells to the first global lines GSSL_A[0:4], GWL_A0 to GWL_A15, GPG_A, and GDSL_A[0:4] or the second global lines GSSL_B[0:4], GWL_B0 to GWL_B15, GPG_B, and GDSL_B[0:4].

The coupling circuits 132_0 to 132_m may be coupled between the first global lines GSSL_A[0:4], GWL_A0 to GWL_A15, GPG_A, and GDSL_A[0:4] or the second global lines GSSL_B[0:4], GWL_B0 to GWL_B15, GPG_B, and GDSL_B[0:4], and the local lines SSL[0:4], WL0 to WL15, PG, and DSL[0:4] of the memory blocks 110MB, and operate in response to block selection signals Vsel_0 to Vsel_k from the block selection circuit 133, respectively. In other words, the coupling circuits 132_0 to 132_m may selectively couple the first global lines GSSL_A[0:4], GWL_A0 to GWL_A15, GPG_A, and GDSL_A[0:4] or the second global lines GSSL_B[0:4], GWL_B0 to GWL_B15, GPG_B, and GDSL_B[0:4] to the local lines SSL[0:4], WL0 to WL15, PG, and DSL[0:4] of the selected memory block 110MB in response to the block selection signals Vsel_0 to Vsel_k from the block selection circuit 133 so that the operating voltages (e.g., a program voltage, an erase voltage, a read voltage, a pass voltage, a pipe gate voltage, a verify voltage, etc.) output from the voltage generation circuit 131 to the first global lines GSSL_A[0:4], GWL_A0 to GWL_A15, GPG_A, and GDSL_A[0:4] or the second global lines GSSL_B[0:4], GWL_B0 to GWL_B15, GPG_B, and GDSL_B[0:4] may be transferred to the local lines SSL[0:4], WL0 to WL15, PG, and DSL[0:4] of the selected memory block 110MB. At least two coupling circuits may operate in response to a single block selection signal. For example, the coupling circuits 132_0 and 132_1 may operate in response to the block selection signal Vsel_0, and the coupling circuits 132_m-1 and 132_m may operate in response to the block selection signal Vsel_k.

The respective coupling circuits 132_0 to 132_m may include transistors (not illustrated) coupled between the first global lines GSSL_A[0:4], GWL_A0 to GWL_A15, GPG_A, and GDSL_A[0:4] or the second global lines GSSL_B[0:4], GWL_B0 to GWL_B15, GPG_B, and GDSL_B[0:4] and the local lines SSL[0:4], WL0 to WL15, PG, and DSL[0:4] of the memory block.

In a flash memory device, the coupling circuits 132_0 to 132_m may be provided to each of the memory blocks 110MB, and the coupling circuits 132_0 to 132_m may selectively operate in response to determination signals (Vsel_0 to Vsel_k) from the block selection circuit 133. For example, only two coupling circuits selected in response to the block selection signals Vsel_0 to Vsel_k from the block selection circuit 133, among the coupling circuits 132_0 to 132_m, may selectively operate.

The block selection circuit 133 may output the block selection signals Vsel_0 to Vsel_k to the coupling circuits 132_0 to 132_m in response to the row address signal RADD. A single block selection signal may be output to at least two coupling circuits. One of the block selection signals Vsel_0 to Vsel_k may be activated in response to the row address signal RADD, and the other signals may be deactivated. The coupling circuits 132_0 to which the activated block selection signal Vsel_0 is input may transfer the operating voltages output to the first global lines GSSL_A[0:4], GWL_A0 to GWL_A15, GPG_A, and GDSL_A[0:4] to the selected memory block 110MB without voltage drop. In addition, the coupling circuits 132_1 to which the activated block selection signal Vsel_0 is input may electrically couple the second global lines GSSL_B[0:4], GWL_B0 to GWL_B15, GPG_B, and GDSL_B[0:4] and the local lines SSL[0:4], WL0 to WL15, PG, and DSL[0:4] of the selected memory block 110MB. However, the second global lines GSSL_B[0:4], GWL_B0 to GWL_B15, GPG_B, and GDSL_B[0:4] may be in a floating state so that any operating voltage may not be applied thereto. The coupling circuits 132_m-1 and 132_m to which the deactivated block selection signals Vsel_k is input may block the operating voltages output to the first global lines GSSL_A[0:4], GWL_A0 to GWL_A15, GPG_A, and GDSL_A[0:4] or the second global lines GSSL_B[0:4], GWL_B0 to GWL_B15, GPG_B, and GDSL_B[0:4] from being transferred to the memory block 110MB.

Referring to FIGS. 1 and 11, the operation circuit (120 to 140) may apply the dummy pulse Vdummy having a positive potential to the local lines SSL[0:4], WL0 to WL15, PG, and DSL[0:4] of the selected memory block, among all memory blocks, after the program loop or the erase loop is completed. In addition, the operation circuit may apply the dummy pulse Vdummy having a positive potential to the local lines SSL[0:4], WL0 to WL15, PG, and DSL[0:4] of the selected memory block, among all memory blocks, before a read operation is performed.

More specifically, the voltage generation circuit 131 may output the dummy pulse Vdummy to the first global lines GSSL_A[0:4], GWL_A0 to GWL_A15, GPG_A, and GDSL_A[0:4] or the second global lines GSSL_B[0:4], GWL_B0 to GWL_B15, GPG_B, and GDSL_B[0:4] in response to a control signal (e.g., CMDv) from the control circuit. The block selection circuit 133 may activate one of the block selection signals Vsel_0 to Vsel_k in response to a control signal (e.g., RADD) from the control circuit. In response to the activated block selection signal (e.g., Vsel_0), the coupling circuits 132_0 to 132_1 may couple the local lines SSL[0:4], WL0 to WL15, PG, and DSL[0:4] of the memory blocks 110MB to the global lines GSSL[0:4], GWL0 to GWL15, GPG, and GDSL[0:4]. As a result, the local lines SSL[0:4], WL0 to WL15, PG, and DSL[0:4] of all memory blocks 110MB may be coupled to the first global lines GSSL_A[0:4], GWL_A0 to GWL_A15, GPG_A, and GDSL_A[0:4] or the second global lines GSSL_B[0:4], GWL_B0 to GWL_B15, GPG_B, and GDSL_B[0:4], and the dummy pulse Vdummy may be applied to only one memory block coupled to the first global lines GSSL_A[0:4], GWL_A0 to GWL_A15, GPG_A, and GDSL_A[0:4] or the second global lines GSSL_B[0:4], GWL_B0 to GWL_B15, GPG_B, and GDSL_B[0:4] to which the dummy pulse Vdummy is applied.

When the dummy pulse Vdummy is applied, the operation circuit (120 to 140) may apply a ground voltage (e.g., 0V) to the bit lines BL and the common source line SL as shown in FIG. 2B of the memory blocks 110MB.

Since the dummy pulse Vdummy is applied as described above, a channel region of memory cells may be initialized to prevent errors from occurring during a read operation and improve operational reliability.

The voltage supply circuit described above with reference to FIG. 11 may operate in substantially the same manner as operating the semiconductor memory device as described above with reference to FIGS. 4 to 10.

Figure 12:
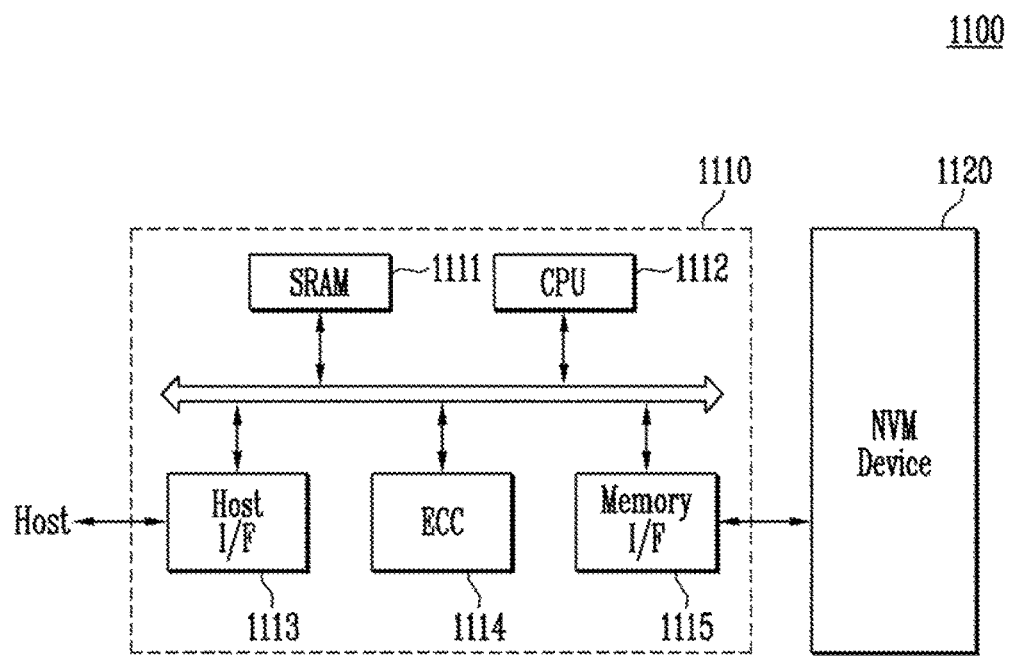
FIG. 12 is a schematic block diagram illustrating a memory system according to an embodiment.

FIG. 12 is a schematic block diagram illustrating a memory system according to an embodiment.

As illustrated in FIG. 12, the memory system 1100 according to the embodiment may include a non-volatile memory device 1120 and a memory controller 1110.

The non-volatile memory device 1120 may correspond to the semiconductor device described above with reference to FIG. 1. In addition, the non-volatile memory device 1120 may be configured by memory blocks and an operation circuit as described above with reference to FIG. 3. The memory system 1100 having the above-described configuration may be a solid state disk/drive (SSD) or a memory card in which the memory device 1120 and the memory controller 1110 are combined. An SRAM 1111 may serve as an operation memory of a CPU 1112. A host interface 1113 may include a data exchange protocol for a host coupled to the memory system 1100. In addition, an ECC 1114 may detect and correct errors included in data read from a cell region of the non-volatile memory device 1120. A memory interface 1115 may interface with the non-volatile memory device 1120. The CPU 1112 may perform general control operations for data exchange with the memory controller 1110.

Though not shown in FIG. 12, the memory controller 1110 may further include a read-only memory (ROM) that stores code data to interface with the host. The non-volatile memory device 1120 may be a multi-chip package including a plurality of flash memory chips. The memory system 1100 may be highly reliable with improved operating characteristics. The flash memory device according to an embodiment may be provided in a memory system such as a semiconductor disk device, for example, a solid state disk/drive (SSD), which is being researched. When the memory system 1100 is an SSD, the memory controller 1110 may communicate with an external device, e.g., a host, through one of the interface protocols including USB, MMC, PCI-E, SATA, PATA, SCSI, ESDI and IDE.

Figure 13:
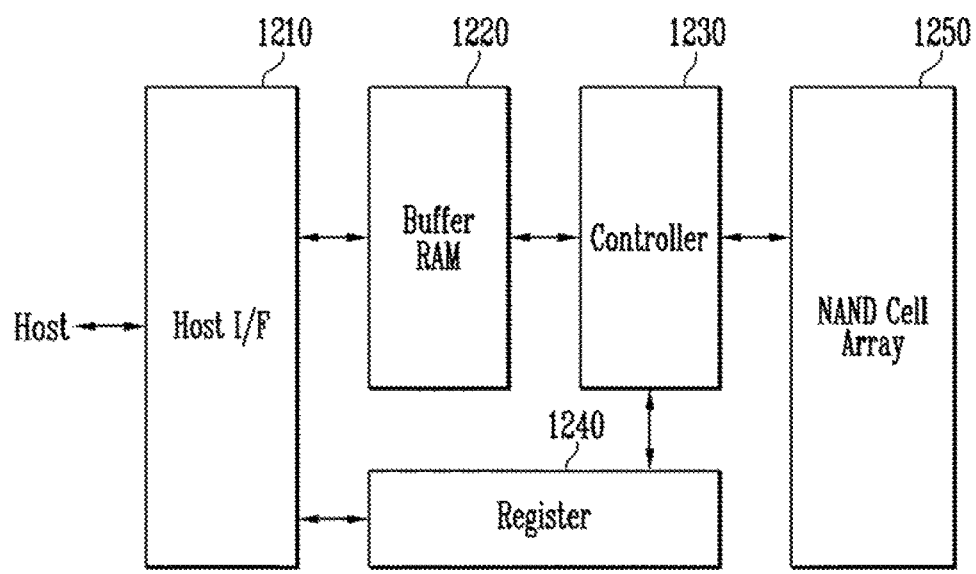
FIG. 13 is a schematic block diagram illustrating a fusion memory device or a fusion memory system performing a program operation according to an embodiment.

FIG. 13 is a schematic block diagram illustrating a fusion memory device or a fusion memory system performing a program operation. For example, the technical features of the present invention may be applied to a OneNand flash memory 1200 as the fusion memory device.

Referring to FIG. 12, the OneNand flash memory 1200 may include a host interface (I/F) 1210, a buffer RAM 1220, a controller 1230, a register 1240 and a NAND flash cell array 1250. The host interface 1210 may be configured to exchange various types of information with a device through a different protocol. The buffer RAM 1220 may store codes for driving the memory device or temporarily storing data. The controller 1230 may be configured to control read and program operations, and every state based on a control signal and a command that are externally given. The register 1240 may be configured to store data including instructions, addresses and configurations defining a system operating environment in the memory device. The NAND flash cell array 1250 may include operating circuits including non-volatile memory cells and page buffers. In response to a write request from a host, the OneNand flash memory 1200 may program data in the aforementioned manner.

Figure 14:
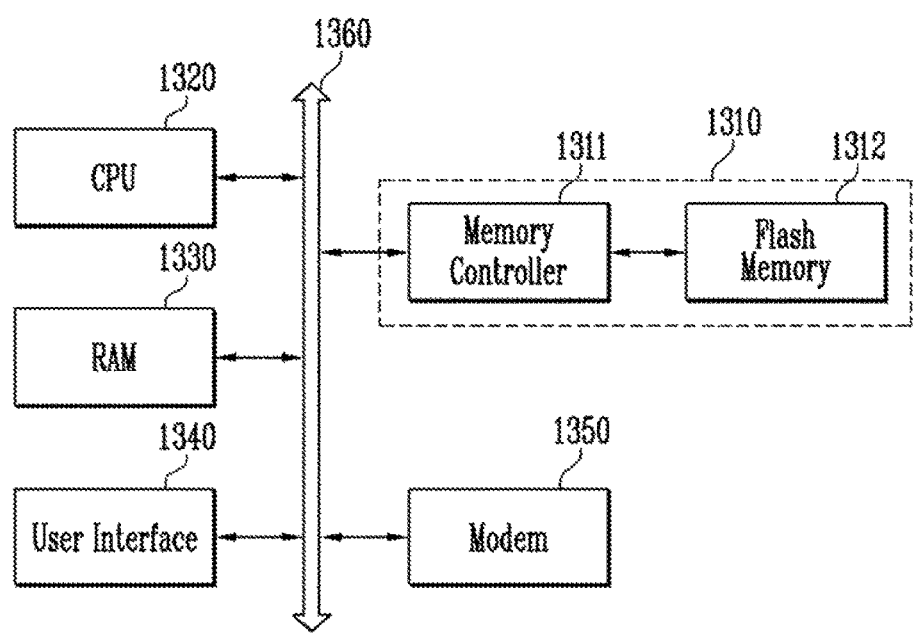
FIG. 14 is a schematic block diagram illustrating a flash memory device according to an embodiment.

FIG. 14 is a schematic block diagram of a computing system 1300 including a flash memory device 1312 according to an embodiment of the present invention.

Referring to FIG. 13, the computing system 1300 may include a CPU 1320, a RAM 1330, a user interface 1340, a modem 1350, such as a baseband chipset, and a memory system 1310 that are electrically coupled to a system bus 1360. If the computing system 1300 is a mobile device, a battery may be provided to apply operating voltages to the computing system 1300. Though not shown in FIG. 13, the computing system 1300 may further include application chipsets, a camera image processor, or mobile DRAM. The memory system 1310 may form a solid-state disk/drive (SSD) that uses the non-volatile memory described above with reference to FIG. 1 in order to store data. The memory system 1310 may be provided as a fusion flash memory, e.g., a fusion flash memory, e.g., a OneNAND flash memory.

According to embodiments of the present invention, a semiconductor device may improve operational reliability and accuracy.

It will be apparent to those skilled in the art that various modifications can be made to the above-described exemplary embodiments of the present invention without departing from the spirit or scope of the invention. Thus, it is intended that the present invention cover all such modifications provided they come within the scope of the appended claims and their equivalents.

What is claimed is:
1. A semiconductor device, comprising:
  a plurality of memory blocks including a plurality of memory cells, wherein the plurality of memory cells are divided into a plurality of pages; and
  an operation circuit configured to output operating voltages to local lines of a selected memory block, among the plurality of memory blocks, to perform a program operation, a read operation and an erase operation on the selected memory block,
  wherein the operation circuit comprises:
    a voltage generation circuit configured to output the operating voltages to first or second global lines; and coupling circuits configured to couple local lines of the memory blocks to the first or second global lines in response to block selection signals, wherein the operation circuit is configured to apply a dummy pulse having a positive potential to the local lines of the selected memory block after completing the program operation, the read operation and the erase operation.

2. The semiconductor device of claim 1, wherein the operation circuit further comprises:

a read/write circuit coupled to bit lines of the memory blocks, wherein the voltage generation circuit is configured to output the dummy pulse to the first or second global lines.

3. The semiconductor device of claim 1, wherein the coupling circuits couple local lines of at least two of the memory blocks to the first and second global lines, respectively, in response to one of the block selection signals.

4. The semiconductor device of claim 1, wherein the coupling circuits are configured to couple the local lines of the selected memory block, among the memory blocks, to the first or second global lines to which the dummy pulse is applied when the voltage generation circuit outputs the dummy pulse to the first or second global lines.

5. The semiconductor device of claim 1, wherein the operation circuit is configured to output the dummy pulse to the local lines of the selected memory block when completing the program operation on memory cells included in a selected page of the selected memory block.

6. The semiconductor device of claim 5, wherein the operation circuit is configured to stop performing the program operation, apply the dummy pulse having the positive potential to the local lines of the selected memory block, and perform the read operation when a read command is input before the program operation of the selected page is completed.

7. The semiconductor device of claim 6, wherein the operation circuit is configured to resume the program operation after completing the read operation.

8. The semiconductor device of claim 1, wherein the operation circuit is configured to output the dummy pulse to the local lines of the selected memory block after completing the erase operation on the selected memory block.

9. The semiconductor device of claim 8, wherein the operation circuit is configured to stop performing the erase operation, apply the dummy pulse having the positive potential to the local lines of the selected memory block, and perform the read operation when a read command is input before the erase operation of the selected memory block is completed.

10. The semiconductor device of claim 9, wherein the operation circuit is configured to resume the erase operation on the selected memory block after completing the read operation.

11. The semiconductor device of claim 1, wherein the operation circuit is configured to additionally apply the dummy pulse having the positive potential to the local lines of the selected memory block before performing the read operation.

12. The semiconductor device of claim 1, wherein the operation circuit is configured to apply a ground voltage to bit lines and a common source line of the memory blocks when the dummy pulse is applied to the local lines.

* * * * *